United States Patent
Rieutort-Louis et al.

(10) Patent No.: US 10,748,981 B1
(45) Date of Patent: Aug. 18, 2020

(54) SIGNAL ROUTING IN ORGANIC LIGHT-EMITTING DIODE DISPLAYS

(71) Applicant: Apple Inc., Cupertino, CA (US)

(72) Inventors: Warren S. Rieutort-Louis, Cupertino, CA (US); Bhadrinarayana Lalgudi Visweswaran, Santa Clara, CA (US); Abbas Jamshidi Roudbari, San Jose, CA (US); Jean-Pierre S. Guillou, Los Gatos, CA (US); Tyler R. Kakuda, Stockton, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/361,933

(22) Filed: Mar. 22, 2019

Related U.S. Application Data

(60) Provisional application No. 62/688,969, filed on Jun. 22, 2018.

(51) Int. Cl.
| | |
|---|---|
| *H01L 27/32* | (2006.01) |
| *G06F 3/041* | (2006.01) |
| *G09G 3/3291* | (2016.01) |

(52) U.S. Cl.
CPC ........ *H01L 27/3276* (2013.01); *G06F 3/0412* (2013.01); *G06F 3/0416* (2013.01); *G09G 3/3291* (2013.01); *H01L 27/323* (2013.01); *H01L 27/3246* (2013.01)

(58) Field of Classification Search
CPC ............... H01L 27/3276; H01L 27/323; H01L 27/3246; G06F 3/0416; G06F 3/0412; G09G 3/3291
See application file for complete search history.

(56) References Cited

U.S. PATENT DOCUMENTS

| | | | |
|---|---|---|---|
| 6,684,007 B2 | 1/2004 | Yoshimura et al. | |
| 8,272,877 B2 | 9/2012 | Stokoe et al. | |
| 9,047,039 B2 | 6/2015 | Perkins et al. | |
| 9,697,763 B2 | 7/2017 | Meisner | |
| 10,032,148 B2 | 7/2018 | Glaser | |
| 10,241,609 B2 | 3/2019 | Jung et al. | |
| 10,388,227 B2 * | 8/2019 | Kim | G09G 3/3266 |
| 2005/0088404 A1 | 4/2005 | Heines et al. | |
| 2014/0210784 A1 | 7/2014 | Gourevitch et al. | |
| 2016/0111040 A1 * | 4/2016 | Kim | G02F 1/13454 345/698 |
| 2016/0327987 A1 | 11/2016 | Huitema et al. | |

(Continued)

*Primary Examiner* — Bryan Earles
(74) *Attorney, Agent, or Firm* — Treyz Law Group, P.C.; Joseph F. Guihan

(57) ABSTRACT

An organic light-emitting diode display may have thin-film transistor circuitry formed on a substrate. The substrate may have rounded corners, a first tail portion along a lower edge, and a second tail portion along an additional edge. A first plurality of signal paths for the display may be routed to the first tail portion and a second plurality of signal paths for the display may be routed to the second tail portion. The second tail portion may be formed within a pixel-free notched region of the substrate. One or more data lines, power supply lines, touch sensor signal lines, and other signal lines may be routed to the second tail portion. Each tail portion of the substrate may be planar or may be bent. Vertical data lines at the edge of the display may be coupled to data line extensions that are routed through the active area of the display.

19 Claims, 14 Drawing Sheets

(56) References Cited

U.S. PATENT DOCUMENTS

| | | | |
|---|---|---|---|
| 2017/0301280 A1* | 10/2017 | Ka | G09G 3/3406 |
| 2017/0357113 A1* | 12/2017 | Yamazaki | G02F 1/1335 |
| 2018/0075810 A1* | 3/2018 | Kim | G09G 3/3275 |
| 2018/0151663 A1* | 5/2018 | Kim | H01L 27/3262 |
| 2019/0131360 A1* | 5/2019 | Lee | G09G 3/3233 |
| 2019/0304366 A1* | 10/2019 | Ka | H01L 27/3248 |
| 2019/0325827 A1* | 10/2019 | Lee | G09G 3/3225 |

\* cited by examiner

SIGNAL ROUTING IN ORGANIC LIGHT-EMITTING DIODE DISPLAYS

This application claims the benefit of provisional patent application No. 62/688,969, filed Jun. 22, 2018, which is hereby incorporated by reference herein in its entirety.

BACKGROUND

This relates generally to electronic devices and, more particularly, to electronic devices with organic light-emitting diode displays.

Electronic devices often include displays. For example, an electronic device may have an organic light-emitting diode display based on organic-light-emitting diode pixels. Each pixel may have a pixel circuit that includes a respective light-emitting diode. Thin-film transistor circuitry in the pixel circuit may be used to control the application of current to the light-emitting diode in that pixel. The thin-film transistor circuitry may include a drive transistor. The drive transistor and the light-emitting diode in a pixel circuit may be coupled in series between a positive power supply and a negative power supply.

Challenges may arise in distributing touch, power, and data signals in displays having layouts in which signal routing space is limited.

It would therefore be desirable to be able to provide improve ways to distribute signals such as touch sensor, power supply, and data signals on a display such as an organic light-emitting diode display.

SUMMARY

An organic light-emitting diode display may have thin-film transistor circuitry formed on a substrate. The display and substrate may have rounded corners. A pixel definition layer may be formed on the thin-film transistor circuitry. Openings in the pixel definition layer may be provided with emissive material overlapping respective anodes for organic light-emitting diodes.

The substrate may have a first tail portion along a lower edge and a second tail portion along an additional edge. A first plurality of signal paths for the display may be routed to the first tail portion and a second plurality of signal paths for the display may be routed to the second tail portion. The second tail portion may be formed within a pixel-free notched region of the substrate.

One or more data lines, power supply lines, touch sensor signal lines, and other control signal lines may be routed to the first tail portion, and one or more data lines, power supply lines, touch sensor signal lines, and other control signal lines may be routed to the second tail portion. Routing some of the signal lines to the second tail portion may allow the first tail portion to be reduced and size and for the size of the inactive area of the display to be reduced.

Each tail portion of the substrate may be planar or may be bent. The tail portion may be bent 90° or 180° around a bend axis. Alternatively, an edge of the active area may be bent around a bend axis. To allow additional reduction of the size of the inactive area of the display, vertical data lines at the edge of the display may be coupled to data line extensions that are routed through the active area of the display to provide the vertical data lines with signals.

DETAILED DESCRIPTION

Figure 1:
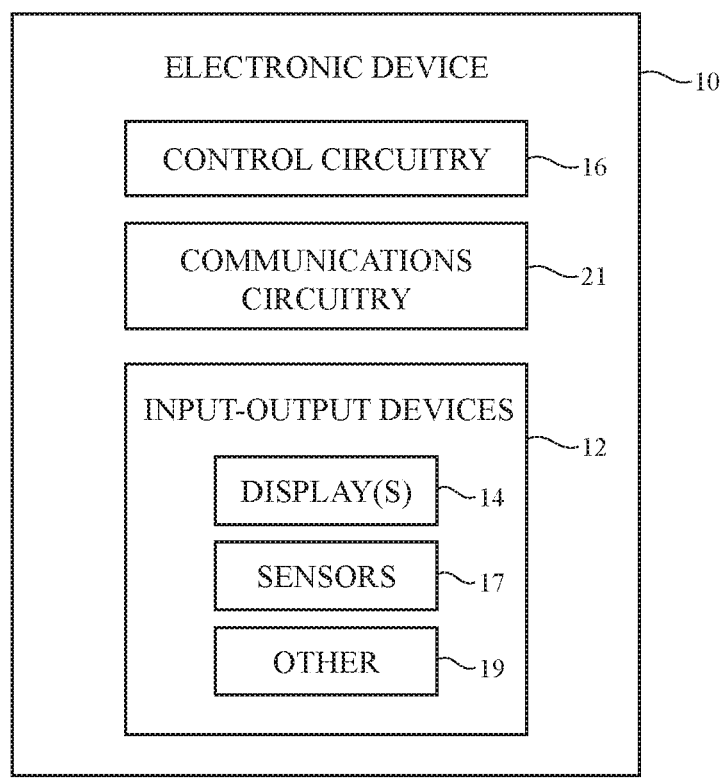
FIG. 1 is a diagram of an illustrative electronic device having a display in accordance with an embodiment.

An illustrative electronic device of the type that may be provided with an organic light-emitting diode display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

Device 10 may include control circuitry 16. Control circuitry 16 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 16 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 16 may communicate using communications circuitry 21. Circuitry 21 may include antennas, radio-frequency transceiver circuitry, and other wireless communications circuitry and/or wired communications circuitry. Circuitry 21, which may sometimes be referred to as control circuitry and/or control and communications circuitry, may support bidirectional wireless communications between device 10 and external equipment over a wireless link (e.g., circuitry 21 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 12. Input-output devices 12 may be used in gathering user input, in gathering information on the environment surrounding the user, and/or in providing a user with output. Devices 12 may include one or more displays such as display(s) 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 17 in input-output devices 12 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 17 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 17 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 19 in input-output devices 12). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
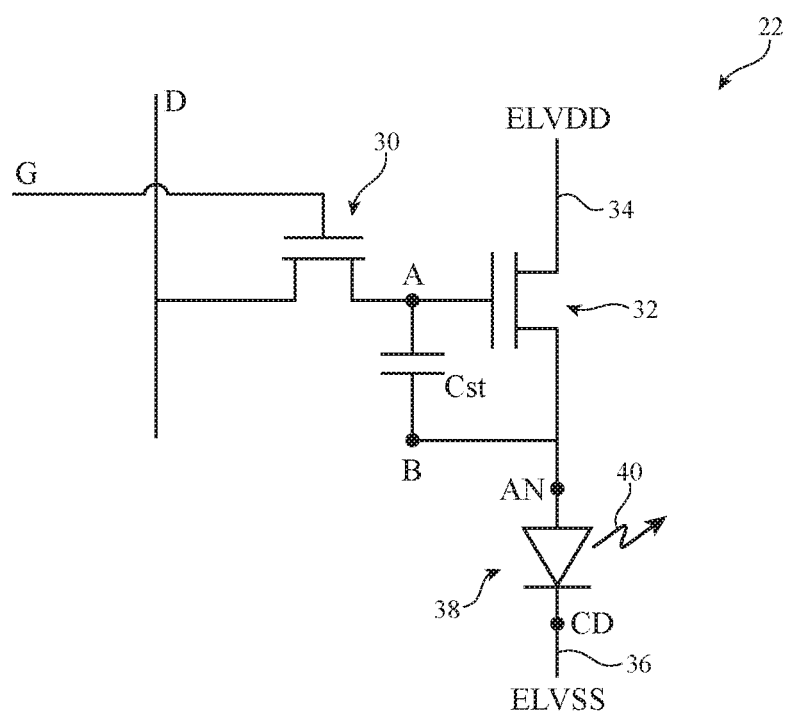
FIG. 2 is a diagram of an illustrative organic light-emitting diode pixel circuit in accordance with an embodiment.

Display 14 may be an organic light-emitting diode display. In an organic light-emitting diode display, each pixel contains a respective organic light-emitting diode. A schematic diagram of an illustrative organic light-emitting diode pixel is shown in FIG. 2. As shown in FIG. 2, display pixel 22 may include light-emitting diode 38. A positive power supply voltage ELVDD may be supplied to positive power supply terminal 34 and a negative power supply voltage ELVSS may be supplied to negative power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to negative terminal 36, so cathode terminal CD of diode 38 may sometimes be referred to as the negative terminal for diode 38.

To ensure that transistor 32 is held in a desired state between successive frames of data, display pixel 22 may include a storage capacitor such as storage capacitor Cst. A first terminal of storage capacitor Cst may be coupled to the gate of transistor 32 at node A and a second terminal of storage capacitor Cst may be coupled to anode AN of diode 38 at node B. The voltage on storage capacitor Cst is applied to the gate of transistor 32 at node A to control transistor 32. Data can be loaded into storage capacitor Cst using one or more switching transistors such as switching transistor 30. When switching transistor 30 is off, data line D is isolated from storage capacitor Cst and the gate voltage on node A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38.

If desired, the circuitry for controlling the operation of light-emitting diodes for pixels 22 in display 14 (e.g., transistors, capacitors, etc. in display pixel circuits such as the display pixel circuit of FIG. 2) may be formed using configurations other than the configuration of FIG. 2 (e.g., configurations that include circuitry for compensating for threshold voltage variations in drive transistor 32, configurations in which an emission enable transistor is coupled in series with drive transistor 32, configurations with multiple switching transistors controlled by multiple respective scan lines, configurations with multiple capacitors, etc.). The circuitry of pixel 22 of FIG. 2 is merely illustrative.

Figure 3:
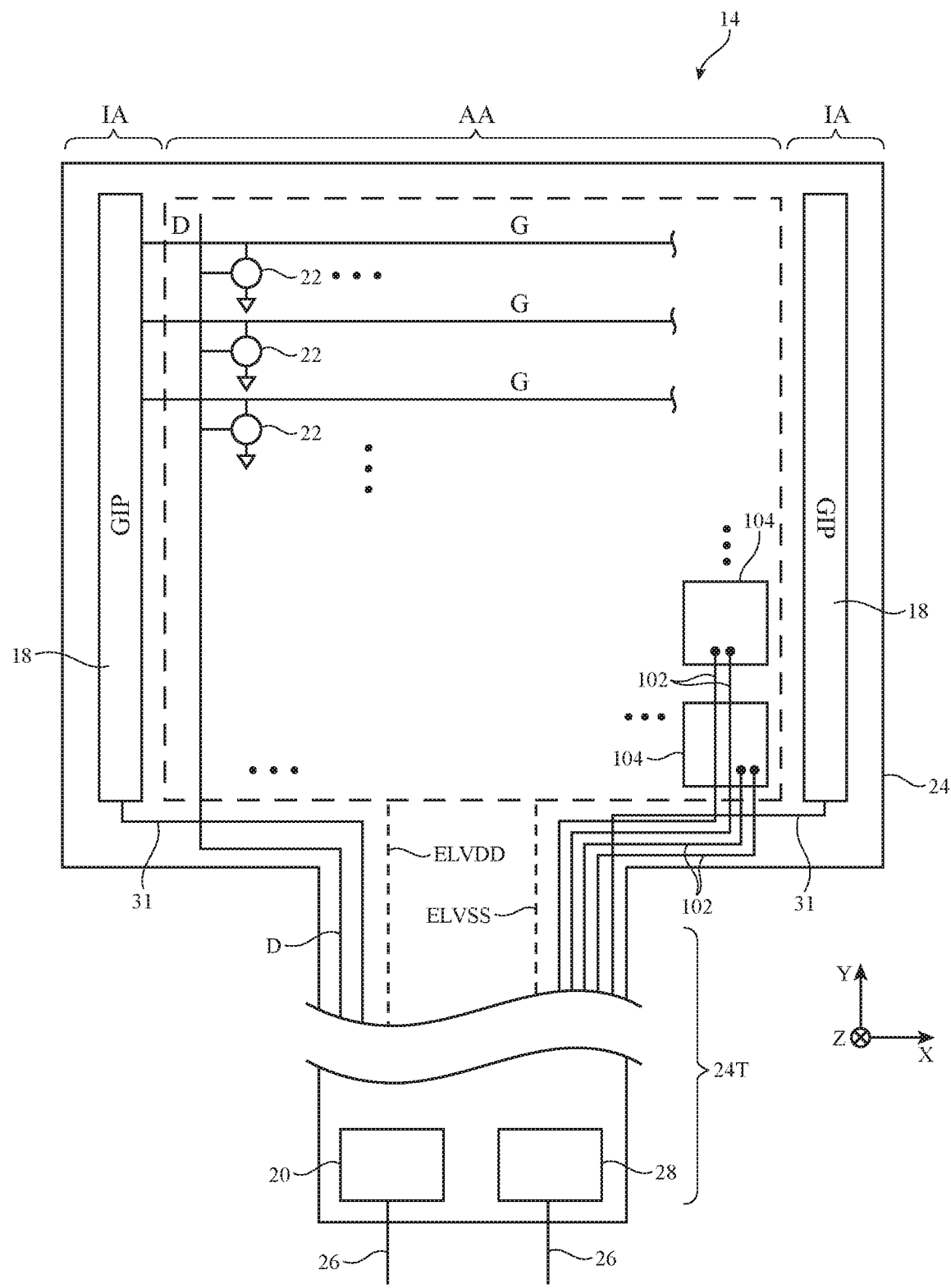
FIG. 3 is a diagram of an illustrative organic light-emitting diode display in accordance with an embodiment.

As shown in FIG. 3, display 14 may include layers such as substrate layer 24. Substrate 24 and, if desired, other layers in display 14, may be formed from layers of material such as glass layers, polymer layers (e.g., flexible sheets of polyimide or other flexible polymers), etc. Substrate 24 may be planar and/or may have one or more curved portions. Substrate 24 may have a rectangular shape with left and right vertical edges and upper and lower horizontal edges or may have a non-rectangular shape. In configurations in which substrate 24 has a rectangular shape with four corners, the corners may, if desired, be rounded. Display substrate 24 may, if desired, have a tail portion such as tail 24T. Tail portion 24T may be flexible and may optionally be bent.

Display 14 may have an array of pixels 22. Pixels 22 form an active area AA of display 14 that displays images for a user. Inactive border portions of display 14 such as inactive areas IA along one or more of the edges of substrate 24 do not contain pixels 22 and do not display images for the user (i.e., inactive area IA is free of pixels 22).

Each pixel 22 may have a light-emitting diode such as organic light-emitting diode 38 of FIG. 2 and associated thin-film transistor circuitry (e.g., the pixel circuit of FIG. 2 or other suitable pixel circuitry). The array of pixels 22 may be formed from rows and columns of pixel structures (e.g., pixels formed from structures on display layers such as substrate 24). There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, and blue pixels that emit blue light. Configurations for display 14 that include pixels of other colors may be used, if desired. The use of a pixel arrangement with red, green, and blue pixels is merely illustrative.

As shown in the example of FIG. 3, display substrate 24 may have a tail portion such as tail 24T that has a narrower width than the portion of substrate 24 that contains active area AA. This arrangement helps accommodate tail 24T within the housing of device 10. Tail 24T may, if desired, be bent under the rest of display 14 when display 14 is mounted within an electronic device housing.

Display driver circuitry 20 for display 14 may be mounted on a printed circuit board (e.g., a flexible printed circuit board or a rigid printed circuit board) that is coupled to tail portion 24T or may be mounted on tail portion 24T. Similarly, touch sensor processing circuitry 28 may be mounted on a printed circuit board (e.g., a flexible printed circuit board or a rigid printed circuit board) that is coupled to tail portion 24T or may be mounted on tail portion 24T. The example of having separately formed display driver circuitry and touch sensor processor circuitry is merely illustrative. If desired, a single integrated circuitry may serve as both the display driver circuitry and touch sensor processor circuitry. Signal paths such as signal path 26 may couple display driver circuitry 20 and touch sensor processing circuitry 28 to control circuitry 16.

Circuitry 20 may include one or more display driver integrated circuits and/or thin-film transistor circuitry. During operation, the control circuitry of device 10 (e.g., control circuitry 16 of FIG. 1) may supply circuitry such as display driver circuitry 20 with information on images to be displayed on display 14. To display the images on display pixels 22, display driver circuitry 20 may supply corresponding image data to data lines D while issuing clock signals and other control signals to supporting display driver circuitry such as gate driver circuitry (GIP) 18. Control signals may be provided to gate driver circuitry 18 from display driver circuitry 20 using signal paths such as signal paths 31 in FIG. 3. Gate driver circuitry 18 may produce gate line signals (sometimes referred to as scan signals, emission enable signals, etc.) or other control signals for pixels 22. The gate line signals may be conveyed to pixels 22 using lines such as gate lines G. There may be one or more gate lines per row of pixels 22. Gate driver circuitry 18 may include integrated circuits and/or thin-film transistor circuitry and may be located along the edges of display 14 (e.g., along the left and/or right edges of display 14 as shown in FIG. 3) or elsewhere in display 14 (e.g., as part of circuitry 20 on tail 24T, along the lower edge of display 14, etc.). The configuration of FIG. 3 is merely illustrative.

Display driver circuitry 20 may supply data signals onto a plurality of corresponding data lines D. With the illustrative arrangement of FIG. 3, data lines D run vertically through display 14. Data lines D are associated with respective columns of pixels 22.

With the illustrative configuration of FIG. 3, gate lines G (sometimes referred to as scan lines, emission lines, etc.) run horizontally through display 14. In some embodiments, gate lines G may be coupled to vertical gate line extensions. Each gate line G is associated with a respective row of display pixels 22. If desired, there may be multiple horizontal control lines such as gate lines G associated with each row of pixels 22. Gate driver circuitry 18 may assert gate line signals on the gate lines G in display 14. For example, gate driver circuitry 18 may receive clock signals and other control signals from display driver circuitry 20 and may, in response to the received signals, assert a gate signal on gate lines G in sequence, starting with the gate line signal G in the first row of display pixels 22. As each gate line is asserted, data from data lines D is loaded into the corresponding row of display pixels. In this way, control circuitry in device 10 such as display driver circuitry 20 may provide pixels 22 with signals that direct pixels 22 to generate light for displaying a desired image on display 14.

The circuitry of pixels 22 and, if desired, display driver circuitry such as circuitry 18 and/or 20 may be formed using thin-film transistor circuitry. Thin-film transistors in display 14 may, in general, be formed using any suitable type of thin-film transistor technology (e.g., silicon transistors such as polysilicon thin-film transistors, semiconducting-oxide transistors such as indium gallium zinc oxide transistors, etc.).

Conductive paths (e.g., one or more signal lines, blanket conductive films, and other patterned conductive structures) may be provided in display 14 to route data signals D and power signals such as positive power supply signal ELVDD and negative power supply signal ELVSS to pixels 22. As shown in FIG. 3, these signals may be provided to pixels 22 in active area AA using signal routing paths that receive signals D, ELVDD, and ELVSS from tail portion 24T of display 14. The signal routing path for ELVDD may sometimes be referred to as a positive power supply voltage signal path or positive power supply voltage distribution path. The signal routing path for ELVSS may sometimes be referred to as a negative power supply voltage signal path or negative power supply voltage distribution path.

Any desired signal path arrangements may be used to provide power supply signals ELVDD and ELVSS to pixels 22. Vertical and/or horizontal conductive paths may provide positive power supply signal ELVDD to each pixel (e.g., anode) in the display. For example, the display may include a plurality of vertical conductive paths, with each vertical conductive path providing the positive power supply signal to a respective column of pixels. Alternatively, the display may include a plurality of vertical and horizontal conductive paths (sometimes referred to as a mesh) that provides the positive power supply signal to the pixels in the display. The display may include L-shaped or other bent conductive paths for providing the positive power supply signals to the pixels.

The negative power supply signal ELVSS may be provided to a blanket cathode layer that is formed over the entire display. The cathode layer may cover all of pixels 22 in active area AA of display 14 and may have portions that extend into inactive area IA of display 14 that are coupled to negative power supply paths that supply the cathode layer with negative power supply voltage ELVSS. The cathode layer may be sufficiently thin to be transparent, resulting in a relatively large sheet resistance. To reduce the sheet resistance of the cathode and thereby allow negative power supply voltage ELVSS to be distributed to the cathode terminals of diodes 38 in pixels 22 with minimal IR losses, display 14 may be provided with supplemental conductive paths. For example, vertical and/or horizontal conductive paths (e.g., a mesh) formed in the active area of the display may be connected to negative power supply paths in the inactive area of the display to reduce the resistance. These examples of conductive paths for distributing power supply signals ELVDD and ELVSS are merely illustrative. Any desired arrangement of conductive paths may be used to distribute power supply signals ELVDD and ELVSS to the display.

Touch sensor processing circuitry 28 may include one or more integrated circuits. Touch sensor signal lines 102 may convey signals between touch sensor processing circuitry 28 and electrodes 104. Touch sensor signal lines 102 may be grouped in sets of two or more or three or more individual lines (e.g., sets of parallel lines that are shorted together to help reduce signal line resistance). As shown in FIG. 3, for example, two of lines 102 may be used to couple touch sensor processing circuitry 28 to each electrode. Electrodes 104 (sometimes referred to as touch sensor electrodes 104) may be arranged in an array of rows and columns across display 14. Any desired number of electrodes may be included in the array (e.g., 16 or more electrodes, 32 or more electrodes, 64 or more electrodes, 100 or more electrodes, 500 or more electrodes, less than 500 electrodes, less than 1000 electrodes, etc.). In embodiments where electrodes 104 are formed over pixels 22, the electrodes may be formed from a conductive material that is sufficiently thin to be transparent to allow light emitted from the display to be visible to the viewer.

Figure 4:
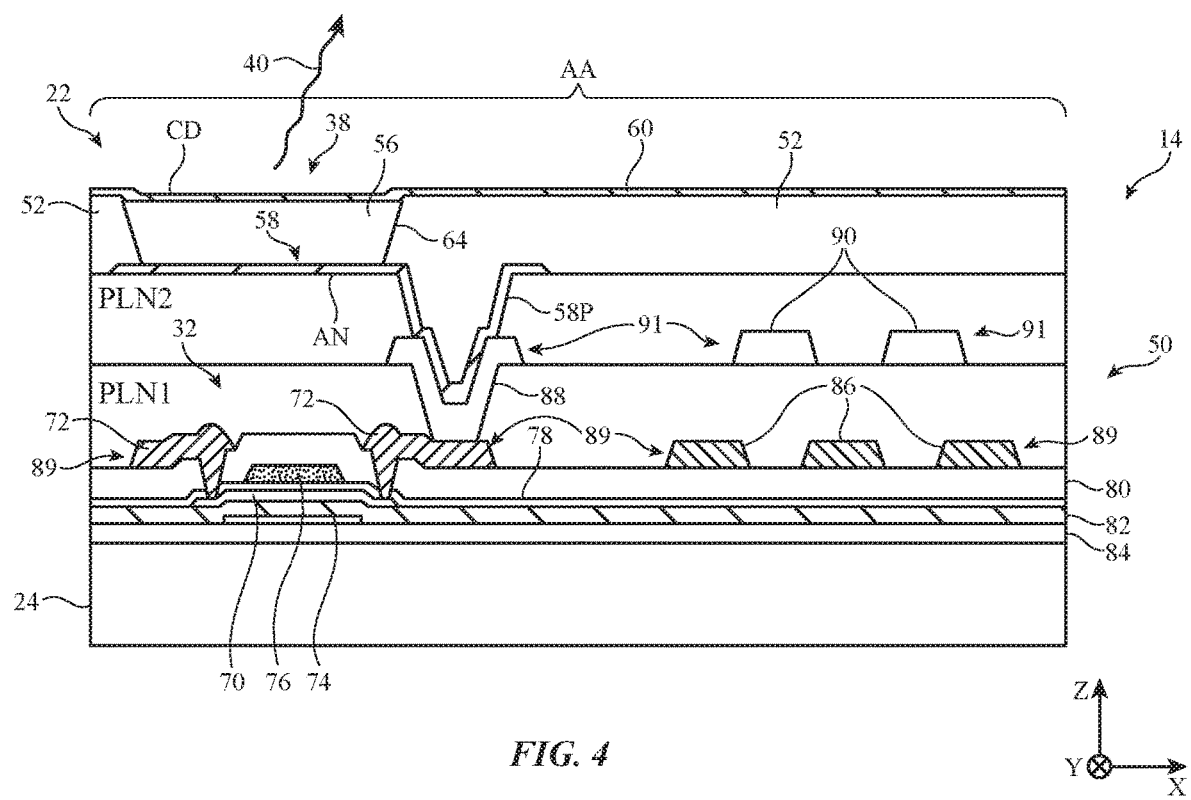
FIG. 4 is a cross-sectional side view of a portion of an active area of an illustrative organic light-emitting diode display in accordance with an embodiment.

A cross-sectional side view of a portion of active area AA of display 14 showing an illustrative configuration that may be used for forming pixels 22 is shown in FIG. 4. As shown in FIG. 4, display 14 may have a substrate such as substrate 24. Thin-film transistors, capacitors, and other thin-film transistor circuitry 50 (e.g., pixel circuitry such as the illustrative pixel circuitry of FIG. 2) may be formed on substrate 24. Pixel 22 may include organic light-emitting diode 38. Anode AN of diode 38 may be formed from metal layer 58 (sometimes referred to as an anode metal layer). Each diode 38 may have a cathode CD from conductive cathode structures such as cathode layer 60. Layer 60 may be, for example, a thin layer of metal such as a layer of magnesium silver with a thickness of 10-18 nm, more than 8 nm, less than 25 nm, etc. Layer 60 may cover all of pixels 22 in active area AA of display 14 and may have portions that extend into inactive area IA display 14 (e.g., so that layer 60 is coupled to negative power supply paths that supply layer 60 with negative power supply voltage ELVSS).

Each diode 38 has an organic light-emitting emissive layer (sometimes referred to as emissive material or an emissive layer structure) such as emissive layer 56. Emissive layer 56 is an electroluminescent organic layer that emits light 40 in response to applied current through diode 38. In a color display, emissive layers 56 in the array of pixels in the display include red emissive layers for emitting red light in red pixels, green emissive layers for emitting green light in green pixels, and blue emissive layers for emitting blue light in blue pixels. In addition to the emissive organic layer in each diode 38, each diode 38 may include additional layers for enhancing diode performance such as an electron injection layer, an electron transport layer, a hole transport layer, and a hole injection layer. Layers such as these may be formed from organic materials (e.g., materials on the upper and lower surfaces of electroluminescent material in layer 56).

Layer 52 (sometimes referred to as a pixel definition layer) has an array of openings containing respective portions of the emissive material of layer 56. An anode AN is formed at the bottom of each of these openings and is overlapped by emissive layer 56. The shape of the diode opening in pixel definition layer 52 therefore defines the shape of the light-emitting area for diode 38.

Pixel definition layer 52 may be formed from a photoimageable material that is photolithographically patterned (e.g., dielectric material that can be processed to form photolithographically defined openings such as photoimageable polyimide, photoimageable polyacrylate, etc.), may be formed from material that is deposited through a shadow mask, or may be formed from material that is otherwise patterned onto substrate 24. The walls of the diode openings in pixel definition layer 52 may, if desired, be sloped, as shown by sloped sidewalls 64 in FIG. 4. Sidewalls 64 may also have curved portions, multiple portions sloped at different angles, etc.

Thin-film circuitry 50 may contain a transistor such as illustrative transistor 32. Thin-film transistor circuitry such as illustrative thin-film transistor 32 of FIG. 4 may have active areas (channel regions) formed from a patterned layer of semiconductor such as layer 70. Layer 70 may be formed from a semiconductor layer such as a layer of polysilicon or a layer of a semiconducting-oxide material (e.g. indium gallium zinc oxide). Source-drain terminals 72 may contact opposing ends of semiconductor layer 70. Gate 76 may be formed from a patterned layer of gate metal or other conductive layer and may overlap semiconductor 70. Gate insulator 78 may be interposed between gate 76 and semiconductor layer 70. A buffer layer such as dielectric layer 84 may be formed on substrate 24 under shield 74. A dielectric layer such as dielectric layer 82 may cover shield 74. Dielectric layer 80 may be formed between gate 76 and source-drain terminals 72. Layers such as layers 84, 82, 78, and 80 may be formed from dielectrics such as silicon oxide, silicon nitride, other inorganic dielectric materials, or other dielectrics. Additional layers of dielectric such as organic planarization layers PLN1 and PLN2 may be included in thin-film transistor structures such as the structures of transistor 32 and may help planarize display 14.

Display 14 may have multiple layers of conductive material embedded in the dielectric layers of display 14 such as metal layers for routing signals through pixels 22. Shield layer 74 may be formed from a first metal layer (as an example). Gate layer 76 may be formed from a second metal layer. Source-drain terminals such as terminals 72 and other structures such as signal lines 86 may be formed from portions of a third metal layer such as metal layer 89. Metal layer 89 may be formed on dielectric layer 80 and may be covered with planarization dielectric layer PLN1. A fourth layer of metal such as metal layer 91 may be used in forming diode via portion 88 and signal lines 90. In active area AA, a fifth layer of metal such as anode metal layer 58 may form anodes AN of diodes 38. The fifth metal layer in each pixel may have a portion such as via portion 58P that is coupled to via portion 88, thereby coupling one of the source-drain terminals of transistor 32 to anode AN of diode 38. A sixth layer of metal (e.g., a blanket film) such as cathode metal layer 60 may be used in forming cathode CD for light-emitting diode 38. Anode layer 58 may be interposed between metal layer 91 and cathode layer 60. Layers such as layer 58, 91, 89, 76, and 74 may be embedded within the dielectric layers of display 14 that are supported on substrate 24. If desired, fewer metal layers may be provided in display 14 or display 14 may have more metal layers. The configuration of FIG. 4 is merely illustrative, and other arrangements for thin-film transistor circuitry 50 may be used if desired.

It is desirable to minimize ohmic losses (sometimes referred to as IR losses) when distributing power signals to pixels 22 to ensure that display 14 operates efficiently and produces images with even brightness across display 14. Ohmic losses may be minimized by incorporating low-resistance signal pathways into through display 14.

Some of the layers of display 14 such as cathode layer 60 may be thin. Cathode layer 60 may be formed from a metal such as magnesium silver. To ensure that cathode CD is sufficiently thin to be transparent, the thickness of layer 60 may be about 10-18 nm (or other suitable thickness). In this type of configuration, the sheet resistance of layer 60 may be relatively large (e.g., about 10 ohm/square). To reduce the sheet resistance of the cathode and thereby allow negative power supply voltage ELVSS to be distributed to the cathode terminals of diodes 38 in pixels 22 with minimal IR losses, display 14 may be provided with supplemental conductive paths. Such paths may also help display 14 of FIG. 4 (or displays with other types of thin-film stackups) accommodate display geometries with geometries that constrain signal distribution (e.g., displays with rounded corners, etc.).

With one illustrative configuration, portions of metal layer 91 may be used in forming signal paths such as signal paths 90 that serve as a supplemental ELVSS path (i.e., a signal path that can operate in parallel with the ELVSS path formed by cathode layer 60) and thereby help to minimize voltage drops and IR losses when operating display 14. Metal layer 91 may be shorted to cathode layer 60 along one or more of the edges of display 14 (e.g., along the left, right, and bottom edges, along two or more edges, three or more edges, etc.) and may provide a low resistance path between a source of signal ELVSS on tail 24T and respective edges of cathode layer 60 (i.e., there may be less resistance experienced when distributing a signal to the edge of layer 60 through signal lines in layer 91 than when distributing a signal to this portion of layer 60 through the thin metal of layer 60 itself). Reducing IR losses as power is supplied to layer 60 helps reduce power losses when driving diodes 38 in active area AA. The use of a portion of layer 91 to form part of the negative power supply path for distributing ELVSS in display 14 may also make it possible to reduce the width of inactive area IA. Portions of layer 91 may also be used to form supplemental conductive paths for distributing ELVDD in display 14.

As previously mentioned, substrate 24 (and, accordingly, the active area of the display) may have a rectangular shape with four corners. One or more of the corners may be rounded corners (e.g., all of the corners may be rounded corners). The active area may optionally have a pixel-free notched region along the upper edge of the display.

Figure 5:
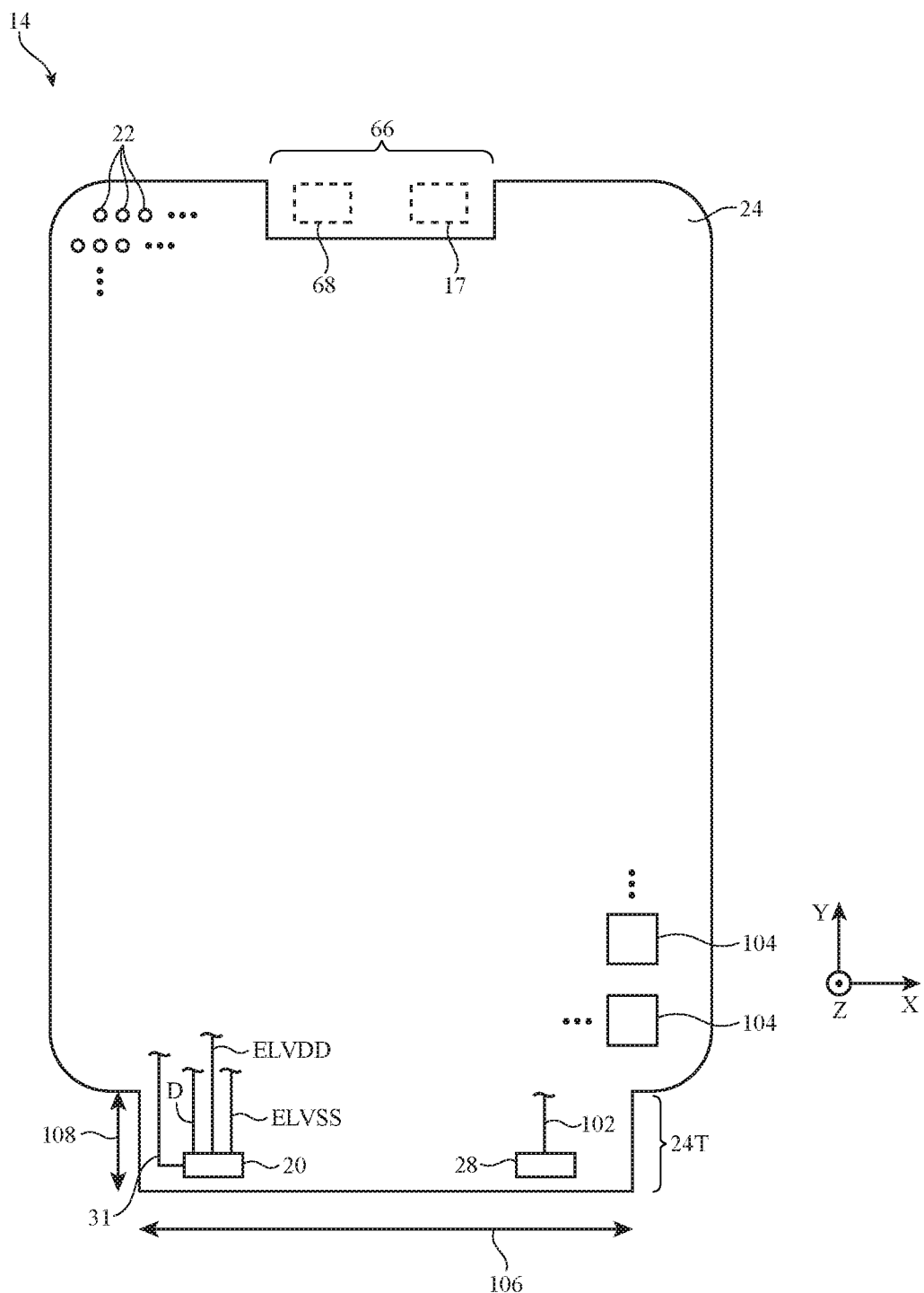
FIG. 5 is a top view of an illustrative display having a rectangular shape with four curved corners, a pixel-free notched region along the upper edge, and a tail portion along the lower edge in accordance with an embodiment.

FIG. 5 is a top view of an illustrative display having a rectangular shape with four curved corners, a recess (i.e., pixel-free notched region 66), and a tail portion 24T along the lower edge of the display. As shown in FIG. 5, the display has parallel upper and lower edges that are connected by parallel left and right edges. A curved (rounded) corner is formed between each set of two adjacent edges. In FIG. 5, pixel-free notched region 66 is formed along the upper edge of the display. The notch interrupts the rows of pixels 22 and creates short rows having fewer pixels than the normal-length rows that span the width of the substrate 24.

Pixel-free notched region 66 (sometimes referred to as notch 66) may optionally accommodate other components in electronic device 10. For example, one or more sensors (e.g., sensors 17 in FIG. 1) may be formed in notch 66. As previously mentioned, notch 66 causes some rows in the display to have a different number of pixels (and may therefore be characterized by different amounts of capacitive loading) than other rows. These capacitive loading differences may cause brightness differences between the rows with different numbers of pixels. To compensate for these capacitive loading differences, rows interrupted by notch 66 may use supplemental gate line loading structures 68. As shown in FIG. 5, supplemental gate line loading structures 68 may be formed within notch 66. This example is merely illustrative, however, and supplemental gate line loading structures 68 may also or instead be formed at any other desired location. Supplemental gate line loading structures 68 may include dummy pixels (e.g., pixels that have some of the same components as pixels 22 but do not emit light), capacitors, or any other desired structures.

In the example of FIG. 5, tail portion 24T is formed along the lower edge of the display (in the inactive area of the display). All of the requisite signal lines within display 14 are therefore routed through tail portion 24T. As shown in FIG. 5, data lines D for providing data to pixels 22 are all routed to tail portion 24T (for simplicity one data line is explicitly drawn in FIG. 5). Power signal distribution paths such as positive power control signal distribution path ELVDD and negative power control signal distribution path ELVSS are all routed to tail portion 24T (for simplicity one ELVDD line and one ELVSS line are explicitly drawn in FIG. 5). Signal paths 31 for providing control signals to the gate driver circuitry are all routed to tail portion 24T (for simplicity one signal path 31 is explicitly drawn in FIG. 5). Touch sensor signal lines 102 for conveying signals between touch sensor control circuitry 28 and touch sensor electrodes 104 are all routed to tail portion 24T (for simplicity one touch sensor signal line is explicitly drawn in FIG. 5). In some embodiments, gate line control signals G may be provided from tail portion 24T to the gate lines using vertical gate line extensions.

Routing all of the aforementioned signal lines through tail portion 24T may require tail portion 24T to have at least a minimum width 106 and length 108. As a result, the size of tail portion 24T may sometimes be larger than desired. For example, it may be desirable to reduce the width of tail portion 24T to minimize the overall size of display 14 for fitting display 14 in an electronic device. However, reducing the width of tail portion 24T may not be feasible given the signal routing requirements. Additionally, routing all of the signals through tail portion 24T may require at least a minimum inactive area border size. The inactive area (particularly in the lower-left and lower-right rounded corners) may need at least a minimum width to accommodate the required signal paths. To enable minimizing the size of tail portion 24T and the inactive area of the display, the display may be provided with additional tail portions as shown in FIGS. 6 and 7.

Figure 6:
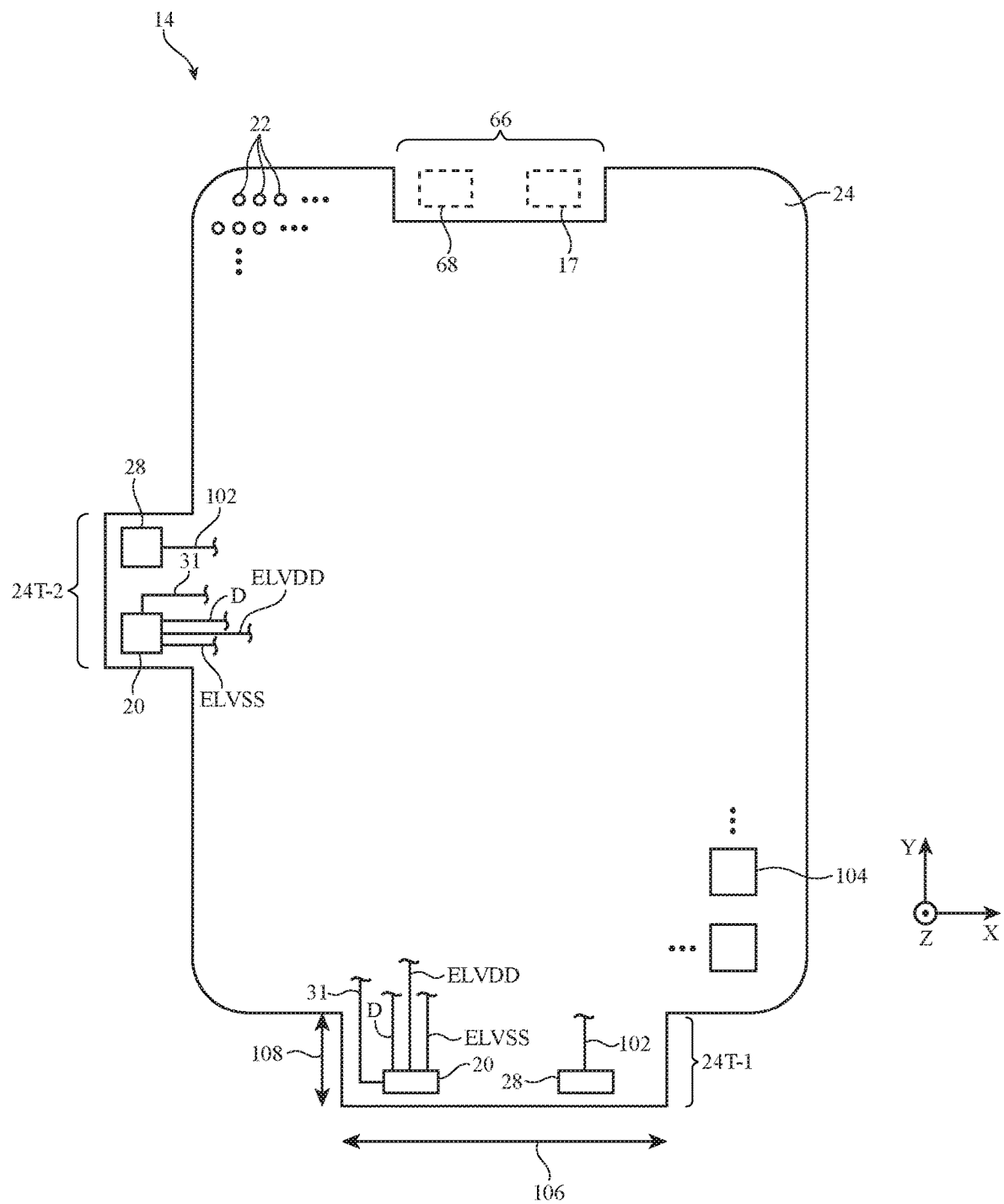
FIG. 6 is a top view of an illustrative display having a rectangular shape with four curved corners, a pixel-free notched region along the upper edge, a tail portion along the lower edge, and an additional tail portion in accordance with an embodiment.
Figure 7:
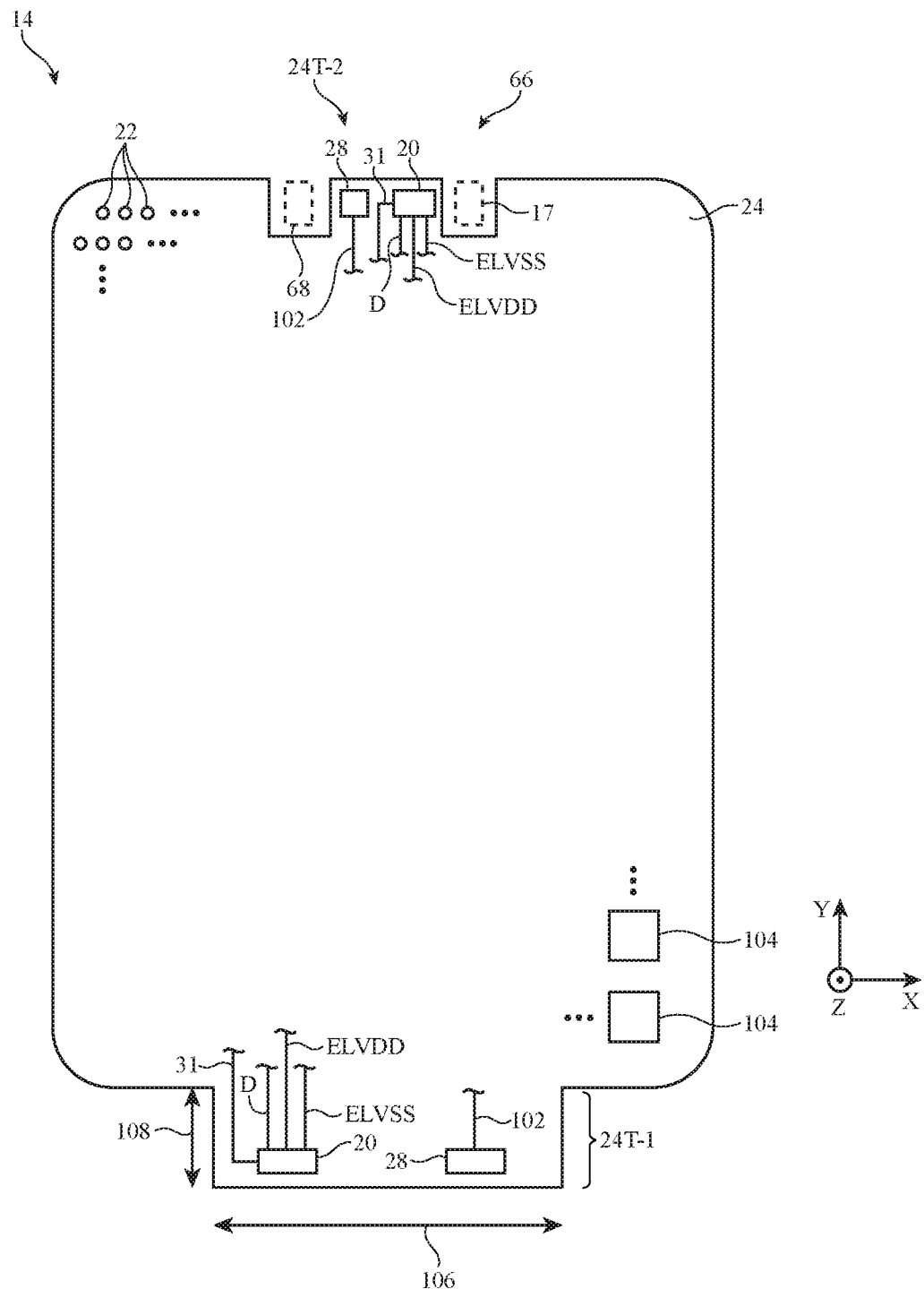
FIG. 7 is a top view of an illustrative display having a rectangular shape with four curved corners, a pixel-free notched region along the upper edge, a tail portion along the lower edge, and an additional tail portion in the pixel-free notched region in accordance with an embodiment.

FIG. 6 is a top view of an illustrative display having a rectangular shape with four curved corners, a recess (i.e., pixel-free notched region 66), a first tail portion 24T-1 along the lower edge of the display, and a second tail portion 24T-2 along the left edge of the display. As shown in FIG. 6, the display has parallel upper and lower edges that are connected by parallel left and right edges. A curved (rounded) corner is formed between each set of two adjacent edges. In FIG. 6, pixel-free notched region 66 is formed along the upper edge of the display. The notch interrupts the rows of pixels 22 and creates short rows having fewer pixels than the normal-length rows that span the width of the substrate 24.

Pixel-free notched region 66 (sometimes referred to as notch 66) may optionally accommodate other components in electronic device 10. For example, one or more sensors (e.g., sensors 17 in FIG. 1) and/or supplemental gate line loading structures 68 may be formed in notch 66 as discussed in connection with FIG. 5.

In the example of FIG. 6, similar to as in FIG. 5, tail portion 24T-1 is formed along the lower edge of the display (in the inactive area of the display). However, in FIG. 6 the display substrate 24 has an additional tail portion 24T-2. Some of the signal lines within the display may be routed to tail portion 24T-2 instead of tail portion 24T-1. This may reduce bottlenecking of signal lines in the lower-left and lower-right rounded corners of the display (allowing reduction of the size of the inactive area in these regions). Routing some of the signal lines to tail portion 24T-2 may also allow the size of tail portion 24T-1 to be reduced. For example, the length 108 of tail portion 24T-1 in FIG. 6 may be less than length 108 of tail portion 24T in FIG. 5. Similarly, width 106 of tail portion 24T-1 in FIG. 6 may be less than width 106 of tail portion 24T in FIG. 5. The reduced size of tail portion 24T-1 may allow additional components to be accommodated within the volume of electronic device 10 that contains display 14.

The signal lines within display 14 may be routed to either tail portion 24T-1 or tail portion 24T-2 in any desired manner Some, all, or no data lines D for providing data to pixels 22 may be routed to tail portion 24T-1 (for simplicity one data line is explicitly drawn being routed to tail portion 24T-1 in FIG. 6). Some, all, or no power signal distribution paths such as positive power control signal distribution path ELVDD and negative power control signal distribution path ELVSS may be routed to tail portion 24T-1 (for simplicity one ELVDD line and one ELVSS line are explicitly drawn being routed to tail portion 24T-1 in FIG. 6). Some, all, or no signal paths 31 for providing control signals to the gate driver circuitry may be routed to tail portion 24T-1 (for simplicity one signal path 31 is explicitly drawn being routed to tail portion 24T-1 in FIG. 6). Some, all, or no touch sensor signal lines 102 for conveying signals between touch sensor control circuitry 28 and touch sensor electrodes 104 may be routed to tail portion 24T-1 (for simplicity one touch sensor signal line is explicitly drawn being routed to tail portion 24T-1 in FIG. 6). In some embodiments, gate line control signals G may be provided from tail portion 24T-1 to the gate lines using vertical gate line extensions.

Similarly, some, all, or no data lines D for providing data to pixels 22 may be routed to tail portion 24T-2 (for simplicity one data line is explicitly drawn being routed to tail portion 24T-2 in FIG. 6). Some, all, or no power signal distribution paths such as positive power control signal distribution path ELVDD and negative power control signal distribution path ELVSS may be routed to tail portion 24T-2 (for simplicity one ELVDD line and one ELVSS line are explicitly drawn being routed to tail portion 24T-2 in FIG. 6). Some, all, or no signal paths 31 for providing control signals to the gate driver circuitry may be routed to tail portion 24T-2 (for simplicity one signal path 31 is explicitly drawn being routed to tail portion 24T-2 in FIG. 6). Some, all, or no touch sensor signal lines 102 for conveying signals between touch sensor control circuitry 28 and touch sensor electrodes 104 may be routed to tail portion 24T-2 (for simplicity one touch sensor signal line is explicitly drawn being routed to tail portion 24T-2 in FIG. 6). In some embodiments, gate line control signals G may be provided from tail portion 24T-2 to the gate lines using vertical gate line extensions.

The example in FIG. 6 of supplemental tail portion 24T-2 being formed on the left edge of the display is merely illustrative. Tail portion 24T-2 may instead be formed on the upper edge or right edge of the display if desired.

Display driver circuitry 20 for display 14 may be split into one or more display driver integrated circuits if desired. Each display driver integrated circuit may be mounted on a printed circuit board (e.g., a flexible printed circuit board or a rigid printed circuit board) that is coupled to tail portion 24T-1, may be mounted on a printed circuit board (e.g., a flexible printed circuit board or a rigid printed circuit board) that is coupled to tail portion 24T-2, may be mounted directly on tail portion 24T-1, may be mounted directly on tail portion 24T-2, or may be mounted at another desired location within the electronic device. If split into two or more display driver integrated circuits, one of the display driver integrated circuits may control the remaining display driver integrated circuits. Similarly, touch sensor control circuitry 28 may be split into one or more integrated circuits if desired. Each touch sensor control integrated circuit may be mounted on a printed circuit board (e.g., a flexible printed circuit board or a rigid printed circuit board) that is coupled to tail portion 24T-1, may be mounted on a printed circuit board (e.g., a flexible printed circuit board or a rigid printed circuit board) that is coupled to tail portion 24T-2, may be mounted directly on tail portion 24T-1, may be mounted directly on tail portion 24-2, or may be mounted at another desired location within the electronic device. Display driver circuitry 20 and touch sensor control circuitry 28 may optionally be formed in a single integrated circuit (at any of the aforementioned locations) if desired.

The location of tail 24T-2 in FIG. 6 is merely illustrative. Tail portion 24T-2 may be formed at any desired location within the display. FIG. 7 is a top view of an illustrative display having a rectangular shape with four curved corners, a recess (i.e., pixel-free notched region 66), a first tail portion 24T-1 along the lower edge of the display, and a second tail portion 24T-2 along the upper edge of the display. As shown in FIG. 7, the display has parallel upper and lower edges that are connected by parallel left and right edges. A curved (rounded) corner is formed between each set of two adjacent edges. In FIG. 7, pixel-free notched region 66 is formed along the upper edge of the display. The notch interrupts the rows of pixels 22 and creates short rows having fewer pixels than the normal-length rows that span the width of the substrate 24.

Pixel-free notched region 66 (sometimes referred to as notch 66) may optionally accommodate other components in electronic device 10. For example, one or more sensors (e.g., sensors 17 in FIG. 1) and/or supplemental gate line loading structures 68 may be formed in notch 66 as discussed in connection with FIG. 5. Additionally, in FIG. 7 tail portion 24T-2 is formed in pixel-free notched region 66.

In the example of FIG. 7, similar to as in FIG. 5, tail portion 24T-1 is formed along the lower edge of the display (in the inactive area of the display). However, in FIG. 7 the display substrate 24 has an additional tail portion 24T-2. Some of the signal lines within the display may be routed to tail portion 24T-2 instead of tail portion 24T-1. This may reduce bottlenecking of signal lines in the lower-left and lower-right rounded corners of the display (allowing reduction of the size of the inactive area in these regions). Routing some of the signal lines to tail portion 24T-2 may also allow the size of tail portion 24T-1 to be reduced. For example, the length 108 of tail portion 24T-1 in FIG. 7 may be less than length 108 of tail portion 24T in FIG. 5. Similarly, width 106 of tail portion 24T-1 in FIG. 7 may be less than width 106 of tail portion 24T in FIG. 5. The reduced size of tail portion 24T-1 may allow additional components to be accommodated within the volume of electronic device 10 that contains display 14.

The signal lines within display 14 may be routed to either tail portion 24T-1 or tail portion 24T-2 in any desired manner. Some, all, or no data lines D for providing data to pixels 22 may be routed to tail portion 24T-1 (for simplicity one data line is explicitly drawn being routed to tail portion 24T-1 in FIG. 7). Some, all, or no power signal distribution paths such as positive power control signal distribution path ELVDD and negative power control signal distribution path ELVSS may be routed to tail portion 24T-1 (for simplicity one ELVDD line and one ELVSS line are explicitly drawn being routed to tail portion 24T-1 in FIG. 7). Some, all, or no signal paths 31 for providing control signals to the gate driver circuitry may be routed to tail portion 24T-1 (for simplicity one signal path 31 is explicitly drawn being routed to tail portion 24T-1 in FIG. 7). Some, all, or no touch sensor signal lines 102 for conveying signals between touch sensor control circuitry 28 and touch sensor electrodes 104 may be routed to tail portion 24T-1 (for simplicity one touch sensor signal line is explicitly drawn being routed to tail portion 24T-1 in FIG. 7). In some embodiments, gate line control signals G may be provided from tail portion 24T-1 to the gate lines using vertical gate line extensions.

Similarly, some, all, or no data lines D for providing data to pixels 22 may be routed to tail portion 24T-2 (for simplicity one data line is explicitly drawn being routed to tail portion 24T-2 in FIG. 7). Some, all, or no power signal distribution paths such as positive power control signal distribution path ELVDD and negative power control signal distribution path ELVSS may be routed to tail portion 24T-2 (for simplicity one ELVDD line and one ELVSS line are explicitly drawn being routed to tail portion 24T-2 in FIG. 7). Some, all, or no signal paths 31 for providing control signals to the gate driver circuitry may be routed to tail portion 24T-2 (for simplicity one signal path 31 is explicitly drawn being routed to tail portion 24T-2 in FIG. 7). Some, all, or no touch sensor signal lines 102 for conveying signals between touch sensor control circuitry 28 and touch sensor electrodes 104 may be routed to tail portion 24T-2 (for simplicity one touch sensor signal line is explicitly drawn being routed to tail portion 24T-2 in FIG. 7). In some embodiments, gate line control signals G may be provided from tail portion 24T-2 to the gate lines using vertical gate line extensions.

The example in FIG. 7 of supplemental tail portion 24T-2 and notch 66 being formed on the upper edge of the display is merely illustrative. Tail portion 24T-2 and notch 66 may instead be formed on the left edge or right edge (or lower edge if tail portion 24T-1 is at another location) of the display if desired.

Display driver circuitry 20 for display 14 in FIG. 7 may be split into one or more display driver integrated circuits if desired. Each display driver integrated circuit may be mounted on a printed circuit board (e.g., a flexible printed circuit board or a rigid printed circuit board) that is coupled to tail portion 24T-1, may be mounted on a printed circuit board (e.g., a flexible printed circuit board or a rigid printed circuit board) that is coupled to tail portion 24T-2, may be mounted directly on tail portion 24T-1, may be mounted directly on tail portion 24T-2, or may be mounted at another desired location within the electronic device. If split into two or more display driver integrated circuits, one of the display driver integrated circuits may control the remaining display driver integrated circuits. Similarly, touch sensor control circuitry 28 may be split into one or more integrated circuits if desired. Each touch sensor control integrated circuit may be mounted on a printed circuit board (e.g., a flexible printed circuit board or a rigid printed circuit board) that is coupled to tail portion 24T-1, may be mounted on a printed circuit board (e.g., a flexible printed circuit board or a rigid printed circuit board) that is coupled to tail portion 24T-2, may be mounted directly on tail portion 24T-1, may be mounted directly on tail portion 24-2, or may be mounted at another desired location within the electronic device. Display driver circuitry 20 and touch sensor control circuitry 28 may optionally be formed in a single integrated circuit (at any of the aforementioned locations) if desired.

In one example, all of the touch sensor signal lines 102 may be routed to tail portion 24T-2 and all of the remaining signal lines may be routed to tail portion 24T-1. In another example, approximately half of the touch sensor signal lines 102 may be routed to tail portion 24T-2 and approximately half of the touch sensor signal lines 102 may be routed to tail portion 24T-1. In general, the routing of each line to either tail portion 24T-1 or 24T-2 may depend on the specific design requirements of the display and electronic device.

The examples of FIGS. 6 and 7 of display substrate 24 having two tail portions is merely illustrative. If desired, display substrate 24 may have three or more tail portions, four or more tail portions, etc. Any desired signal paths may be routed to each tail portion.

In addition to reducing the size of the inactive area of the display and the size of the tail portion of the substrate along the lower edge of the display, the embodiments of FIGS. 6 and 7 may result in improved display manufacturing. Substrates 24 (including tail portions) for a plurality of displays may be cut from a single, larger piece of material (sometimes referred to herein as a motherglass). This process may be referred to herein as panelization. The embodiments of FIGS. 6 and 7 may make the overall footprint of substrate 24 smaller in one or two dimensions. This may allow more displays to be formed from a single motherglass, which provides improvements to manufacturing time and cost requirements.

Figure 8:
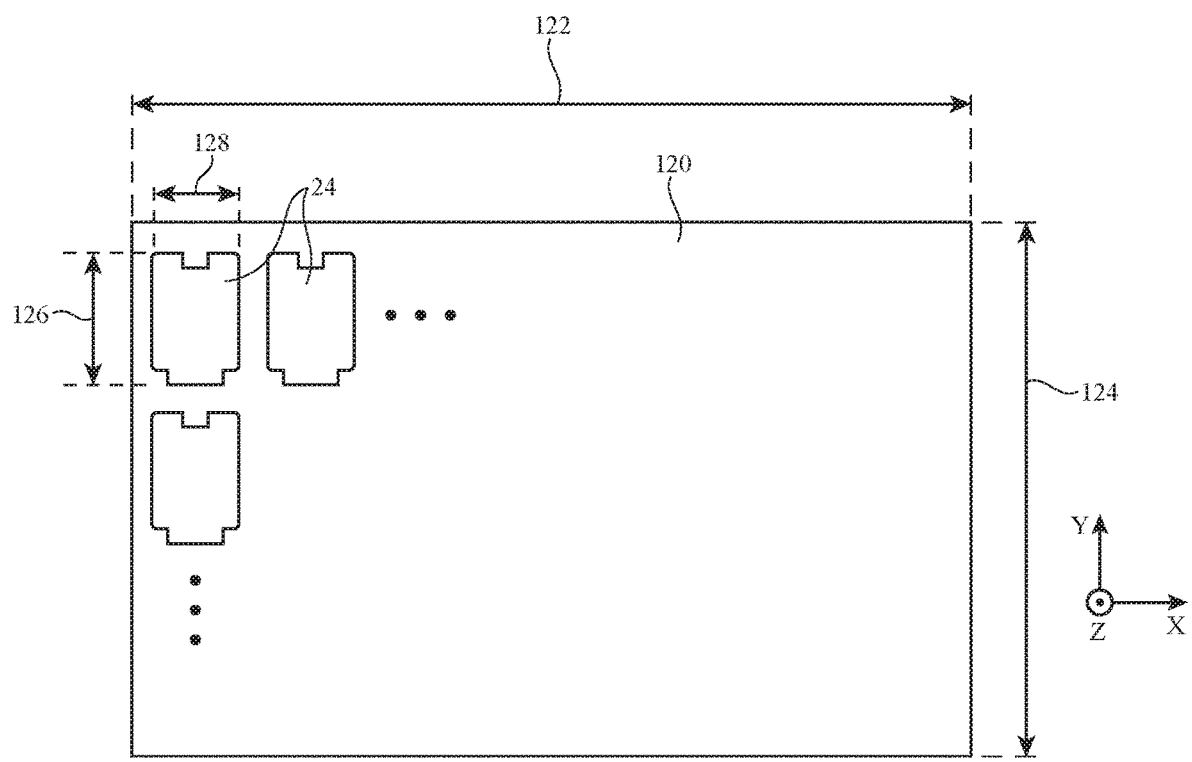
FIG. 8 is a top view of an illustrative motherglass showing how substrates of the type shown in FIG. 5 may be cut from the motherglass in accordance with an embodiment.

FIG. 8 is a top view of an illustrative motherglass 120 from which a plurality of substrates 24 are cut. As shown in FIG. 8, motherglass 120 may have a width 122 and a length 124. A plurality of substrates 24 are cut from the motherglass. Each substrate 24 in FIG. 8 has the shape of the substrate shown in FIG. 5. Each substrate has a footprint with a length 126 and a width 128. A minimum space between each substrate may be required. Otherwise, as many substrates 24 as possible may be cut from the motherglass 120. In some cases, it may be desirable to reduce the length of each substrate in order to fit more rows of substrates in the motherglass. An embodiment with substrates having a reduced length is shown in FIG. 9.

Figure 9:
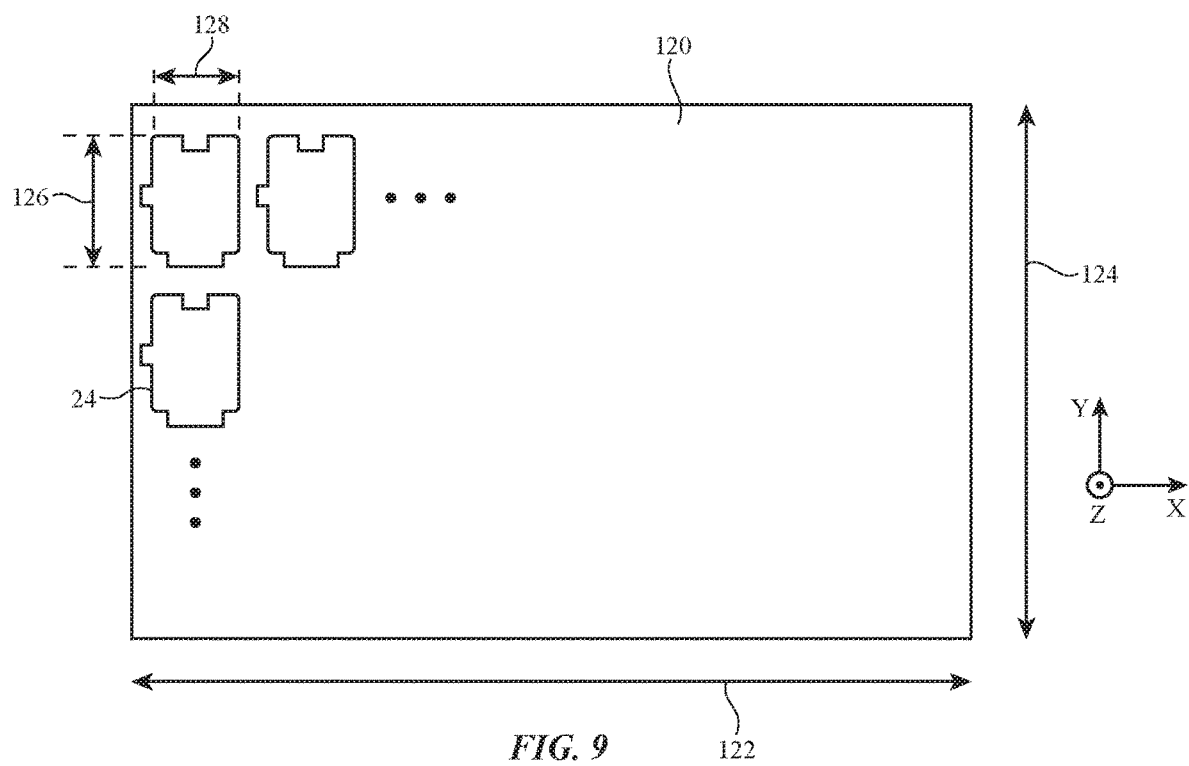
FIG. 9 is a top view of an illustrative motherglass showing how substrates of the type shown in FIG. 6 may be cut from the motherglass in accordance with an embodiment.

FIG. 9 is a top view of an illustrative motherglass 120 from which a plurality of substrates 24 are cut. Each substrate 24 in FIG. 9 has the shape of the substrate shown in FIG. 6. The substrate has a footprint with a length 126 and a width 128. A minimum space between each substrate may be required. Because substrates 24 in FIG. 9 have the additional tail portion along the edge of the substrate (e.g., tail portion 24T-2 in FIG. 6), the tail portion along the lower edge of the substrate (e.g., tail portion 24T-1 in FIG. 6) may be smaller than in the embodiment of FIG. 8. Therefore, length 126 in FIG. 9 may be shorter than length 126 in FIG. 8. The reduced length in FIG. 9 may allow an extra row of substrates to fit in motherglass 120. However, the width 128 of the footprint of each substrate may be increased in FIG. 9 relative to FIG. 8.

Figure 10:
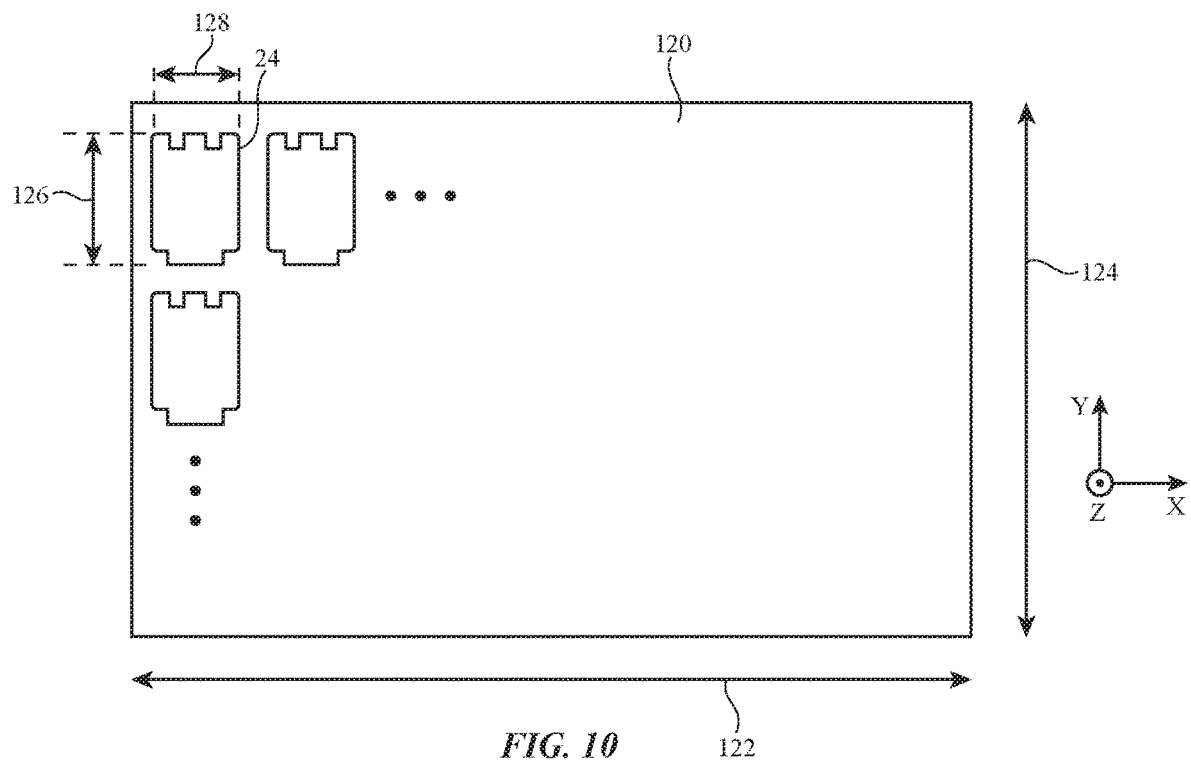
FIG. 10 is a top view of an illustrative motherglass showing how substrates of the type shown in FIG. 7 may be cut from the motherglass in accordance with an embodiment.

FIG. 10 is a top view of an illustrative motherglass 120 from which a plurality of substrates 24 are cut. Each substrate 24 in FIG. 10 has the shape of the substrate shown in FIG. 7. The substrate has a footprint with a length 126 and a width 128. A minimum space between each substrate may be required. Because substrates 24 in FIG. 10 have the additional tail portion along the upper edge of the substrate (e.g., tail portion 24T-2 within pixel-free notched region 66 as shown in FIG. 7), the tail portion along the lower edge of the substrate (e.g., tail portion 24T-1 in FIG. 7) may be smaller than in the embodiment of FIG. 8. Therefore, length 126 in FIG. 10 may be shorter than length 126 in FIG. 8. The reduced length in FIG. 10 may allow an extra row of substrates to fit in motherglass 120. Additionally, in FIG. 9 the reduced length 126 may result in an increased width 128 (possibly causing a column not to fit on the motherglass). In FIG. 10, however, the width 128 is not increased (because the extra tail 24T-2 is formed in the notch 66 along the upper edge of the substrate).

Figure 11:
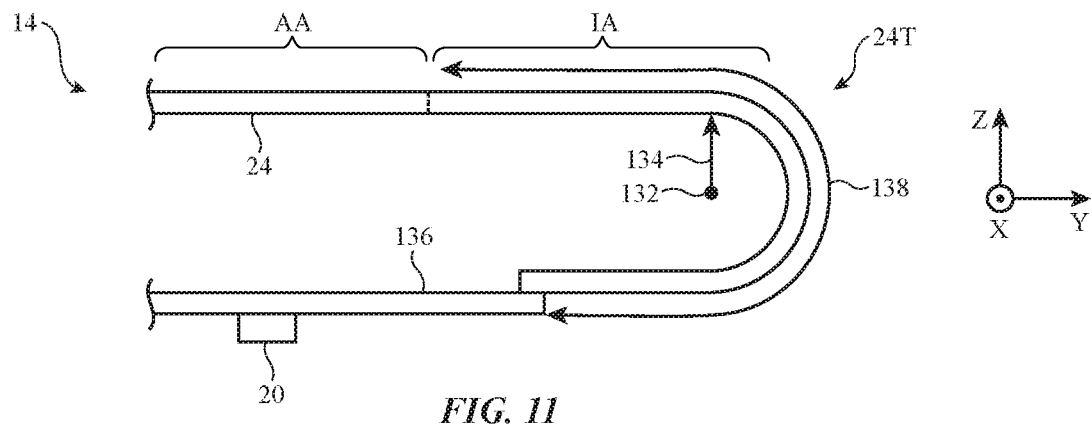
FIG. 11 is a cross-sectional side view of an illustrative display having a display substrate with a tail portion that has a 180° bend in accordance with an embodiment.

Additional panelization improvements may be made by modifying the bend of tail portions of substrate 24. As previously mentioned, each tail portion 24T of the substrate for the display may be bent if desired. FIG. 11 is a cross-sectional side view showing one possible bending arrangement for a tail portion 24T of a substrate. As shown in FIG. 11, substrate 24 may be planar in the active area AA of the display. Tail portion 24T may form a portion of the inactive area IA of the display. Tail portion 24T may be bent around a bend axis 132. In FIG. 11, bend axis 132 extends out of the page and tail portion 24T does a 180° bend around the bend axis. The tail portion 24T may bend around the bend axis with a radius of curvature 134. The tail portion 24T may be coupled to a flexible printed circuit such as flexible printed circuit 136. Circuitry such as display driver circuitry 20 and/or touch sensor control circuitry 28 may be mounted to flexible printed circuit 136. The 180° bend shown in FIG. 11 may result in tail portion 24T having a total length 138.

Figure 12:
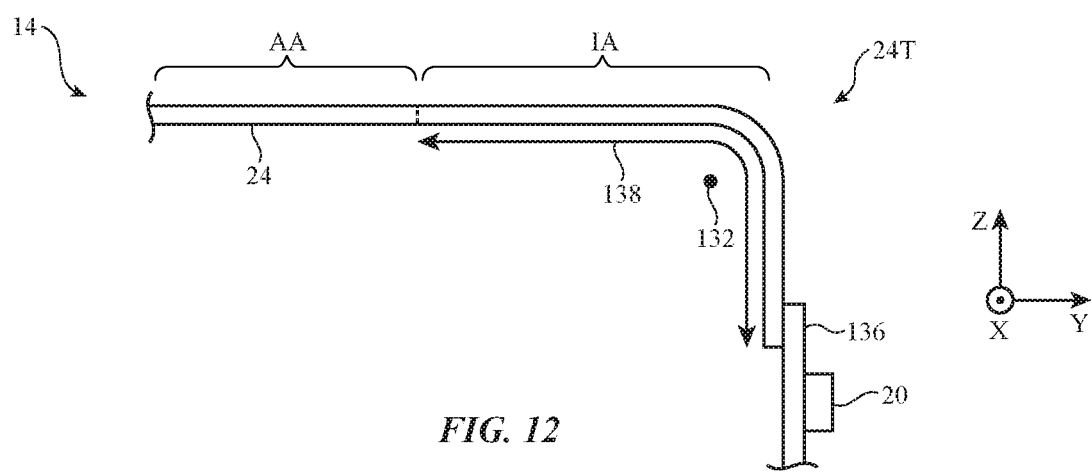
FIG. 12 is a cross-sectional side view of an illustrative display having a display substrate with a tail portion that has a 90° bend in accordance with an embodiment.

Although tail portion 24T in FIG. 11 is bent when incorporated into electronic device 10, the tail portion 24T may be flat during panelization (e.g., a flat footprint is cut from the motherglass and then the tail portion is bent). Therefore, the total length 138 of tail portion 24T in FIG. 11 contributes to the length of the footprint of the substrate during panelization. To reduce the length of the tail portion (and the length of the footprint of the substrate), the tail portion may only be bent 90° around bend axis 132, as shown in FIG. 12. By only bending the tail portion 90°, the total length 138 of the tail portion is reduced by $(\pi r)/2$ (where r is the radius of curvature 134). This reduces the length of the footprint by $(\pi r)/2$ which may reduce the time and costs associated with manufacturing the display substrates.

Figure 13:
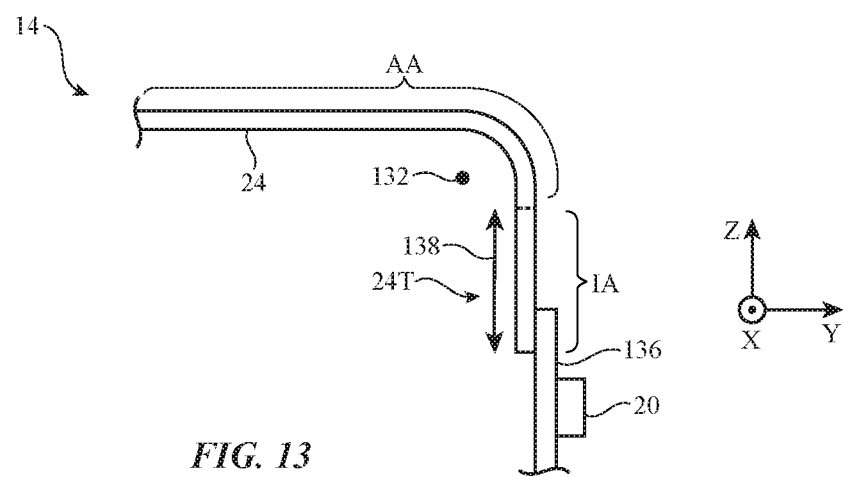
FIG. 13 is a cross-sectional side view of an illustrative display having a display substrate with an active area that has a 90° bend in accordance with an embodiment.

In yet another embodiment, the active area of the display may be bent around bend axis 132. As shown in FIG. 13, the active area of substrate 24 is bent around bend axis 132. Consequently, the overall length 138 of the tail portion 24T is reduced compared with FIGS. 11 and 12. This reduces the length of the footprint of substrate 24 which may reduce the time and costs associated with manufacturing the display substrates.

In FIGS. 11-13, the radius of curvature for each bend may have any desired value. The radius of curvature may be less than 1 millimeter, less than 5 millimeters, less than 0.5 millimeters, greater than 0.2 millimeters, etc.

Tail portion 24T in FIG. 5 may be planar, may be bent as shown in FIG. 11, may be bent as shown in FIG. 12, or may be bent as shown in FIG. 13. Tail portion 24T-1 in FIG. 6 may be planar, may be bent as shown in FIG. 11, may be bent as shown in FIG. 12, or may be bent as shown in FIG. 13. Tail portion 24T-2 in FIG. 6 may be planar, may be bent as shown in FIG. 11, may be bent as shown in FIG. 12, or may be bent as shown in FIG. 13. Tail portion 24T-1 in FIG. 7 may be planar, may be bent as shown in FIG. 11, may be bent as shown in FIG. 12, or may be bent as shown in FIG. 13. Tail portion 24T-2 in FIG. 7 may be planar, may be bent as shown in FIG. 11, may be bent as shown in FIG. 12, or may be bent as shown in FIG. 13. The type of bend selected for each tail portion may depend on panelization considerations, the position of other components within the electronic device, etc.

Figure 14:
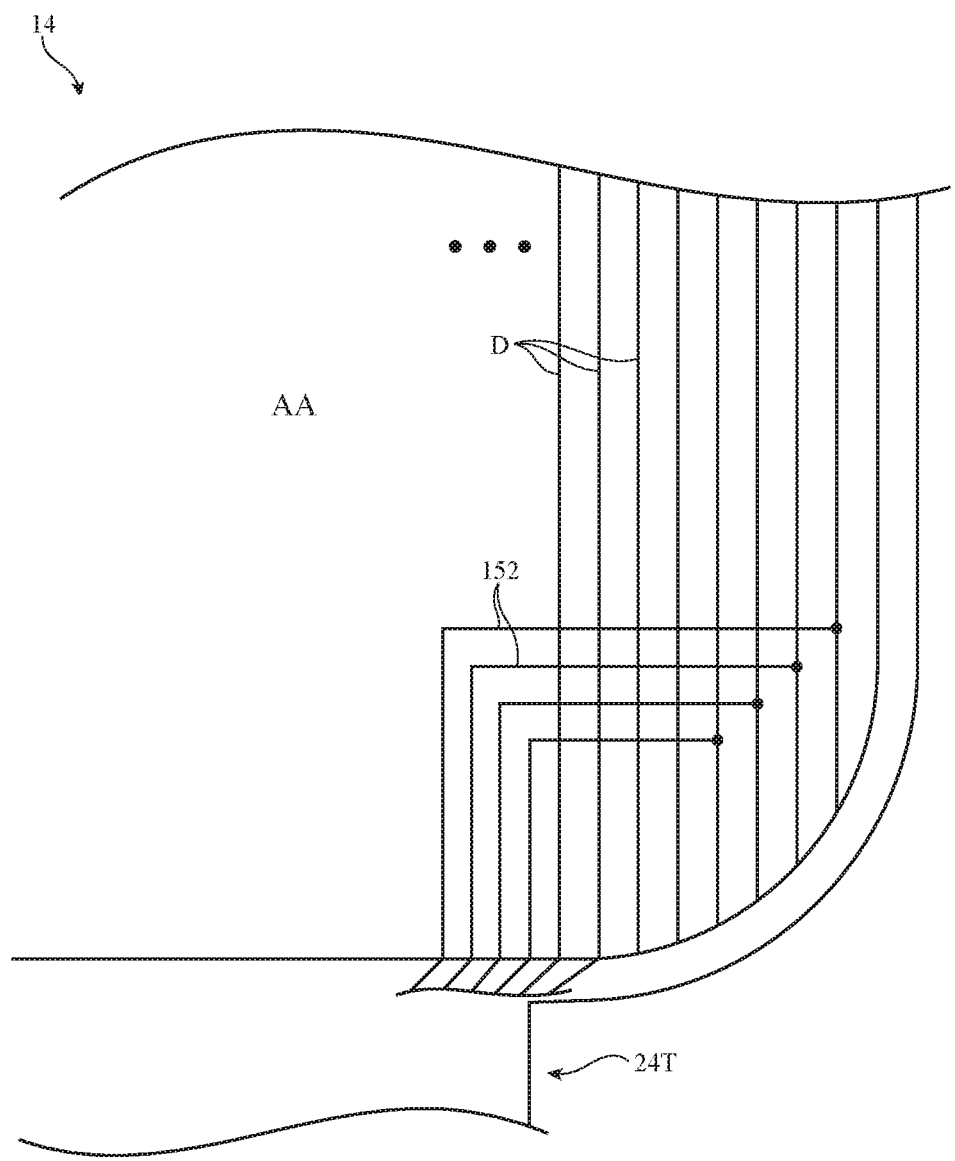
FIG. 14 is a top view of an illustrative display showing how data line extensions may be used to provide signals to vertical data lines at the edge of the display in accordance with an embodiment.
Figure 15:
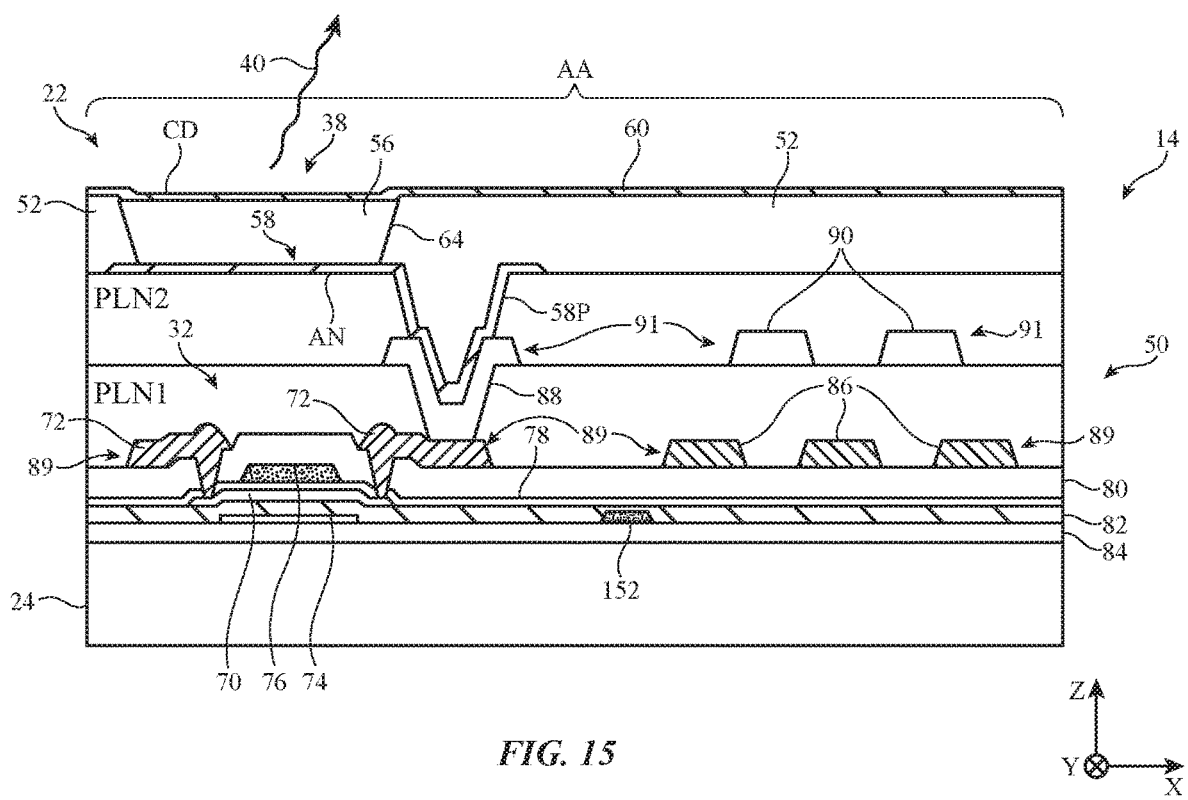
FIG. 15 is a cross-sectional side view of an illustrative display with data line extensions formed between first and second dielectric layers in accordance with an embodiment.
Figure 16:
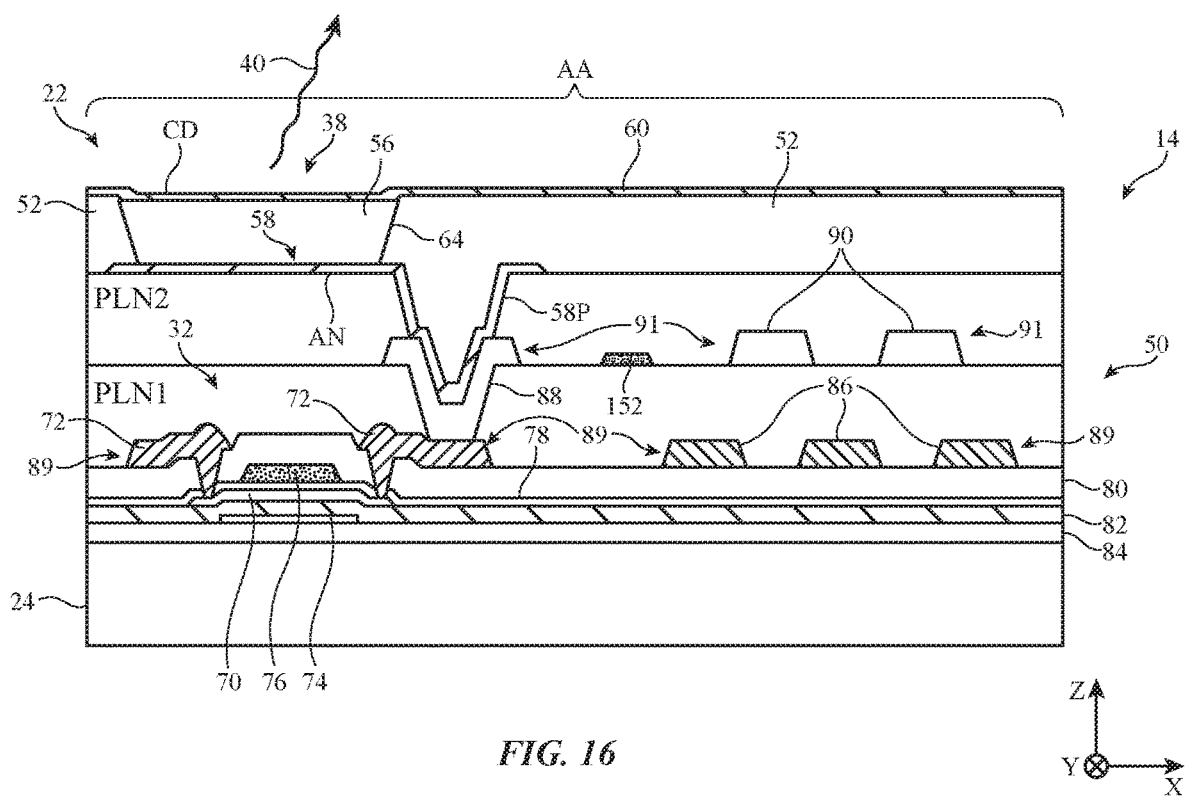
FIG. 16 is a cross-sectional side view of an illustrative display with data line extensions formed between first and second planarization layers in accordance with an embodiment.

An additional technique to reduce the inactive area of the display (particularly in the rounded corners of the display) is shown in FIG. 14. FIG. 14 shows a rounded corner of a display. Vertical data lines D may be coupled to each column of pixels in the pixel array. To provide data to the edge-most vertical data lines in the display, the display may also include data line extensions 152 that pass through the active area of the display to provide signals to vertical data lines D. Data line extensions 152 may be L-shaped or may have two or more L-shaped segments. Data line extensions 152 may have any desired shape to pass through the active area of the display and reach the vertical data lines D. Each data line extension may have any desired number of linear or curved segments. Data line extensions 152 may be incorporated into the display stack-up at any desired location. In one example, shown in FIG. 15, the data line extensions are formed between dielectric layers 82 and 84. In another illustrative example, shown in FIG. 16, the data line extensions are formed between planarization layers PLN1 and PLN2. These examples are merely illustrative, and the data line extensions may be formed at other locations within the display if desired.

The foregoing is merely illustrative and various modifications can be made to the described embodiments. The foregoing embodiments may be implemented individually or in any combination.

What is claimed is:

1. A display comprising:
a substrate having first and second opposing edges connected by third and fourth opposing edges;
an array of pixels formed on the substrate, wherein the substrate has a first tail portion along the first edge, a pixel-free notched region, and a second tail portion formed within the pixel-free notched region;
a first plurality of signal paths that are routed to the first tail portion; and
a second plurality of signal paths that are routed to the second tail portion.

2. The display defined in claim 1, wherein the pixel-free notched region is formed along the second edge of the substrate.

3. The display defined in claim 1, wherein the substrate has a first rounded corner between the first and third edges, a second rounded corner between the second and third edges, a third rounded corner between the first and fourth edges, and a fourth rounded corner between the third and fourth edges.

4. The display defined in claim 1, wherein the second plurality of signal paths includes touch sensor signal paths.

5. The display defined in claim 1, wherein the second plurality of signal paths includes data lines.

6. The display defined in claim 1, wherein the second plurality of signal paths includes a power line that provides a power supply voltage to the array of pixels.

7. The display defined in claim 1, wherein the third and fourth edges are separated by a first width and wherein the first tail portion has a second width that is less than the first width.

8. The display defined in claim 1, wherein one of the first tail portion and the second tail portion is bent 180° around a bend axis.

9. The display defined in claim 1, wherein one of the first tail portion and the second tail portion is bent 90° around a bend axis.

10. The display defined in claim 1, wherein an edge of an active area of the substrate that includes the array of pixels is bent around a bend axis.

11. The display defined in claim 1, further comprising:
supplemental gate line loading structures formed within the pixel-free notched region.

12. An electronic device comprising:
a display that includes a substrate and an array of pixels formed on the substrate, wherein the substrate has a first tail portion along a first edge of the substrate and a second tail portion along a second edge of the substrate;
display driver circuitry;
a first plurality of signal paths that are coupled between the display driver circuitry and the array of pixels, wherein at least some of the first plurality of signal paths are routed to the display driver circuitry through the first tail portion;
touch sensor control circuitry; and
a second plurality of signal paths that are coupled between the touch sensor control circuitry and touch sensor electrodes, wherein at least some of the second plurality of signal paths are routed to the touch sensor control circuitry through the second tail portion.

13. The electronic device defined in claim 12, wherein all of the second plurality of signal paths are routed to the touch sensor control circuitry through the second tail portion.

14. The electronic device defined in claim 12, wherein a first portion of the second plurality of signal paths are routed to the touch sensor control circuitry through the second tail portion and a second portion of the second plurality of signal paths are routed to the touch sensor control circuitry through the first tail portion.

15. The electronic device defined in claim 12, wherein all of the first plurality of signal paths are routed to the display driver circuitry through the first tail portion.

16. The electronic device defined in claim 12, wherein a first portion of the first plurality of signal paths are routed to the display driver circuitry through the first tail portion and a second portion of the first plurality of signal paths are routed to the display driver circuitry through the second tail portion.

17. The electronic device defined in claim 12, wherein the first and second edges of the substrate are opposing edges connected by third and fourth opposing edges.

18. The electronic device defined in claim 12, wherein the substrate has a pixel-free notched region along the second edge and the second tail portion is formed within the pixel-free notched region.

19. The electronic device defined in claim 18, further comprising:
a sensor formed in the pixel-free notched region.

* * * * *